United States Patent
Takewaki

(10) Patent No.: US 8,487,442 B2
(45) Date of Patent: Jul. 16, 2013

(54) SEMICONDUCTOR DEVICE HAVING DUAL DAMASCENE STRUCTURE

(75) Inventor: Toshiyuki Takewaki, Kanagawa (JP)

(73) Assignee: Renesas Electronics Corporation, Kawasaki-Shi, Kanagawa (JP)

(*) Notice: Subject to any disclaimer, the term of this patent is extended or adjusted under 35 U.S.C. 154(b) by 0 days.

(21) Appl. No.: 13/064,394

(22) Filed: Mar. 23, 2011

(65) Prior Publication Data
US 2011/0169172 A1    Jul. 14, 2011

Related U.S. Application Data

(63) Continuation of application No. 12/289,905, filed on Nov. 6, 2008, now Pat. No. 7,936,072.

(30) Foreign Application Priority Data

Nov. 12, 2007    (JP) ................ 2007-292708

(51) Int. Cl.
*H01L 23/48* (2006.01)
*H01L 23/52* (2006.01)

(52) U.S. Cl.
USPC ........................................ 257/773; 257/758

(58) Field of Classification Search
USPC ............... 257/758, 579, 773, 774, E21.585, 257/759
See application file for complete search history.

(56) References Cited

U.S. PATENT DOCUMENTS

| | | | |
|---|---|---|---|
| 6,340,632 B1 | 1/2002 | Fukada et al. | |
| 6,534,868 B2 | 3/2003 | Sekiguchi | |
| 7,244,673 B2 | 7/2007 | Huang et al. | |
| 7,354,855 B2 | 4/2008 | Hotta et al. | |
| 7,550,850 B2 | 6/2009 | Nakashiba | |
| 2005/0186801 A1* | 8/2005 | Uno et al. ............... | 438/706 |
| 2007/0020829 A1 | 1/2007 | Hotta et al. | |
| 2008/0211108 A1 | 9/2008 | Hotta et al. | |
| 2008/0254616 A1 | 10/2008 | Hotta et al. | |

FOREIGN PATENT DOCUMENTS

| | | |
|---|---|---|
| JP | 2000-349150 | 12/2000 |
| JP | 2002-319617 | 10/2002 |
| JP | 2007-19187 | 1/2007 |

* cited by examiner

*Primary Examiner* — Hung Vu
(74) *Attorney, Agent, or Firm* — McGinn Intellectual Property Law Group

(57) ABSTRACT

A semiconductor device, includes a semiconductor substrate, a first wiring layer formed on the semiconductor substrate, the first wiring layer containing a first via having a first aspect ratio and a first wire having a second aspect ratio, the first aspect ratio being equal to or larger than the second aspect ratio, and a second wiring layer overlying the first wiring layer, the second wiring layer containing a second via having a third aspect ratio and a second wire having a fourth aspect ratio, the third aspect ratio being smaller than the fourth aspect ratio.

12 Claims, 7 Drawing Sheets

| DIELECTRIC CONSTANT (@1MHz) | 2.9 |
|---|---|
| REFLECTIVITY (@633nm) | 1.39 |
| STRESS (dyne/cm$^2$) | 7.00E + 0.8 |
| HARDNESS (Gpa) | 0.9 |
| MODULUS OF ELASTICITY (Gpa) | 6 |
| COEFFICIENT OF THERMAL EXPANSION (ppm /deg-C) | 18 |
| GLASS TRANSITION TEMPERATURE (deg-C) | NONE |
| THERMAL CONDUCTIVITY (W /mk@25 deg-C) | 0.31 |

SEMICONDUCTOR DEVICE HAVING DUAL DAMASCENE STRUCTURE

The present application is a Continuation Application of U.S. patent application Ser. No. 12/289,905, filed on Nov. 6, 2008 now U.S. Pat. No. 7,936,072.

This application is based upon and claims the benefit of priority from Japanese patent application No. 2007-292708, filed on Nov. 12, 2007, the disclosure of which is incorporated herein in its entirety by reference.

BACKGROUND OF THE INVENTION

1. Field of the Invention

The present invention relates to a semiconductor device having a multilayer wiring structure formed by a dual damascene method.

2. Description of Related Art

FIG. 2 shows a technique related to a semiconductor device having a multilayer wiring structure as a related art. FIG. 2 shows a cross sectional view of a semiconductor device having a local wiring layer 151 and a power wiring layer 153. Elements such as transistors, not shown, are formed on a semiconductor substrate 101 and on the surface are provided the local wiring layer 151 and the power wiring layer 153. Each of the local wiring layer 151 and the power wiring layer 153 has a dual damascene wiring structure, in which no stopper is provided at the phase boundary between a via layer and a wiring layer (hereinafter, this structure is referred to as the stopper-less structure). The via layer means a layer that includes an interlayer insulation film provided with vias. The wiring layer means a layer that includes an interlayer insulation film provided with wiring grooves.

FIG. 3 shows another example of the semiconductor device of a related art. FIG. 3 shows a dual damascene wiring structure, in which each layer in each of the local wiring layer 151 and the power wiring layer 153 has a stopper layer (106, 114, 124, 134, and 144). Each of those stopper layers functions as an etching stopper at the phase boundary between a via layer and a wiring layer. The dual damascene wiring structure like that is also disclosed in, for example, the patent document (Japanese Unexamined Patent Application Publication No. 2000-349150). According to the patent document, when a wiring pattern is transferred and a wiring groove is formed by etching, a stopper layer controls the depth of the object wiring.

On the other hand, each of the non-patent documents 1 to 3 discloses a structure having a wiring layer of such a dual damascene structure, in which a stopper layer is formed in a local wiring layer and no stopper layer is formed in a power wiring layer.

[Non-patent document 1] High Performance K=2.5 ULK Backend Solution Using an Improved TFHM Architecture, Extendable to the 45 nm Technology Node, R. Fox et al., Technical Digest 2005 IEDM

[Non-patent document 2] A Cost-Effective Low Power Platform for the 45-nm Technology Node, E. Josse et al., 2006, Technical Digest 2006 IEDM

[Non-patent document 3] Advanced 300 mm Cu/CVD LK (k=2.2) Multilevel Damascene Integration for 90/65 nm Generation BEOL Interconnect Technologies, L. P. Li et al., Technical paper 2003 Symposium on VLSI Technology

SUMMARY

However, any of the above-described techniques leaves much room for improvement on the following points.

Along with the progress of semiconductor integrated circuits that are getting micronized more and more, the wiring pitch is also narrowed more and more. And accordingly, in a wiring layer provided with vias disposed closely to each another, it is required to reduce the capacitance between wirings. In a local wiring layer, such reduction of the capacitance between wirings is important to improve the clock operation frequency. Consequently, it has used a low-k film having a small dielectric constant for forming wiring grooves. However, when forming such wiring grooves, a stopper layer that functions as an etching stopper or the like is usually made of a material having a high dielectric constant such as a silicon nitride film. And existence of such a stopper layer works as a negative factor for lowering the dielectric constant of interlayer insulation films, etc.

In case of the structure shown in FIG. 3 and disclosed by the patent document, the existence of the stopper layer causes the dielectric constant to rise. Particularly, in a layer having a narrow wiring width, that is, in the local wiring layer, the capacitance between wirings increases. As a result, the yield of vias is lowered and electro migration (EM) and stress migration (SM) come to occur more easily.

On the other hand, in case of the semiconductor device having a stopper-less structure as shown in FIG. 2, the capacitance between wirings can be reduced. However, in case of the power wiring layer having a wide wiring pitch, the adhesion of the interlayer insulation film between the via layer and the wiring layer is low, so layer separation is apt to occur easily in assembling processes. As a result, the yield is lowered.

The techniques disclosed in the non-patent documents 1 to 3 also have been confronted with the problems similar to those in the examples shown in FIGS. 2 and 3.

According to an exemplary aspect of the present invention, in a semiconductor device having multilayer wirings of the dual damascene structure, the multilayer wirings include a first wiring layer formed on a semiconductor substrate and a second wiring layer formed on the first wiring layer. The first wiring layer includes a first insulation film, plural first vias provided in the first insulation film, a second insulation film provided on the first insulation film, and a first wiring provided on the first vias and connected to those first vias in the second insulation film. The second wiring layer includes a third insulation film, plural second vias provided in the third insulation film, an adhesive layer provided on the third insulation film, a fourth insulation film provided on the adhesive layer, and a second wiring provided on the second vias and connected to those second vias in the fourth insulation film. In the first wiring layer, the aspect ratio L of the wiring having the minimum wiring width and the aspect ratio V of the vias are in a relationship of L≧V. And in the second wiring layer, the aspect ratio L of the wiring having the minimum wiring width and the aspect ratio V of the vias are in a relationship of L<V.

In order to realize the present invention, the inventors have paid attention to the aspect ratios of both wirings and vias and intended to solve the above conventional problems by distinguishing between each layer requiring an adhesive layer and each layer requiring no adhesive layer according to a preset reference. This is why the present invention has come to reduce the capacitance between wirings in each wiring layer having a narrow wiring width. At the same time, the present invention has come to improve the assembling yield by preventing separation between layers in each wiring layer having a wide wiring width and accordingly the capacitance between wirings does not become an important subject.

According to an exemplary aspect of the present invention, therefore, it is possible to provide a semiconductor device capable of reducing the capacitance between wirings in each wiring layer having a narrow wiring width and preventing separation between layers in each wiring layer having a wide wiring width and accordingly the capacitance between wirings does not become an important subject, thereby the assembling yield is improved.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 1A:
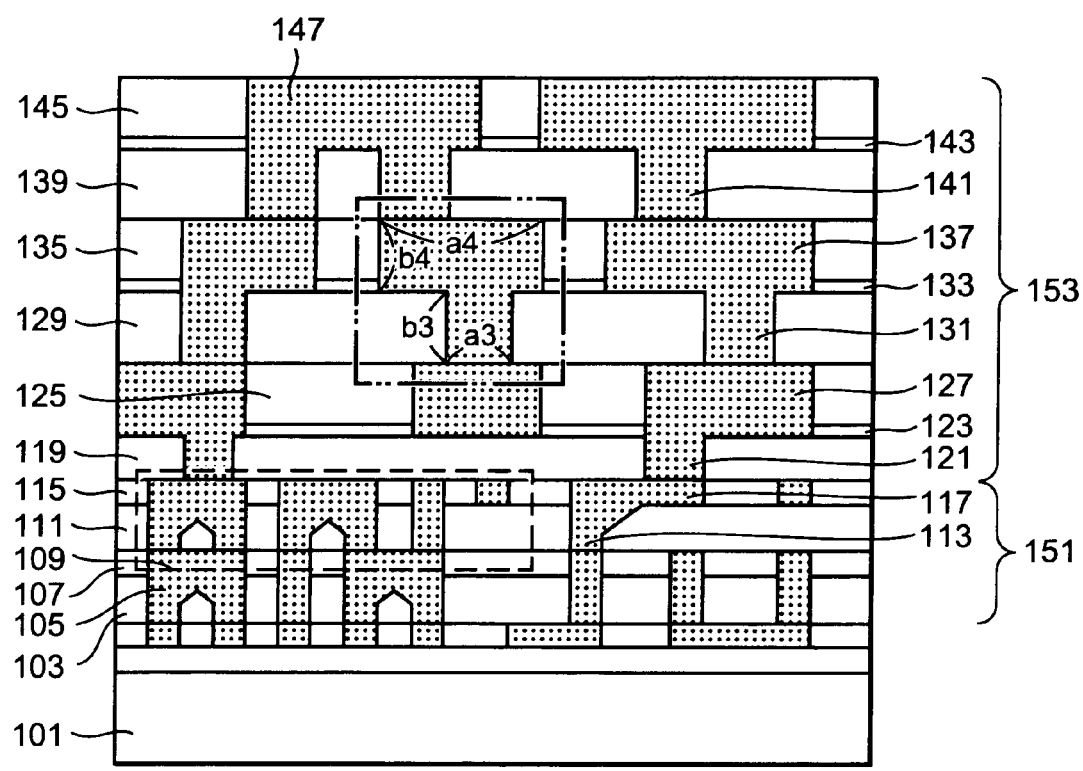
FIG. 1A is an explanatory cross sectional view of a structure of a semiconductor device of the present invention and FIG. 1B is an enlarged view of a portion surrounded in a dot line of FIG. 1A.
Figure 1B:
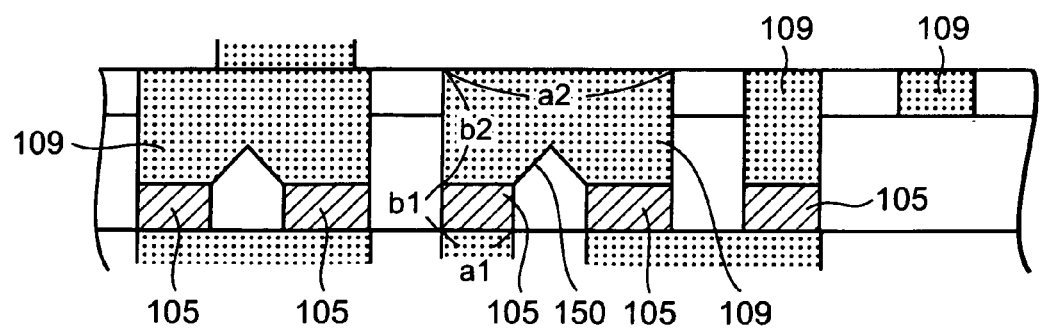
Figure 2:
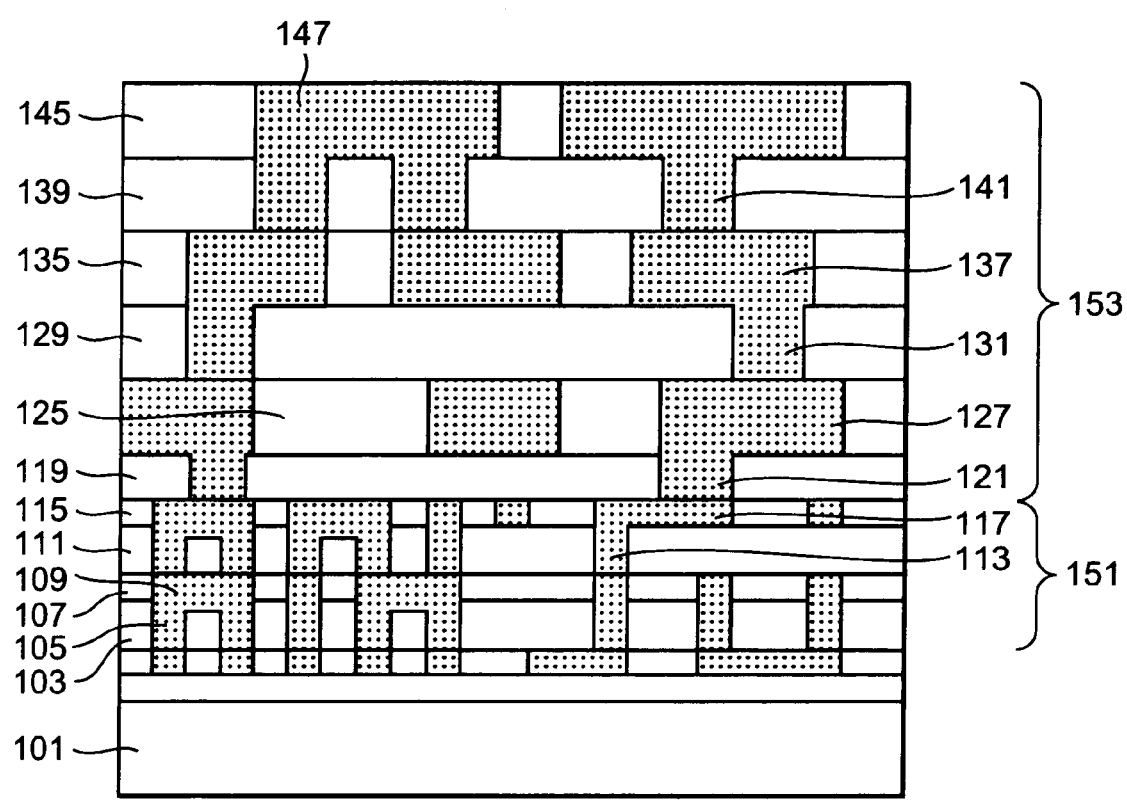
FIG. 2 is an explanatory cross sectional view of a structure of a semiconductor device of a related art.

FIG. 1A is an exemplary cross sectional view of a semiconductor device in a embodiment. FIG. 1B is an enlarged view of the portion surrounded in a dot line of FIG. 1A. In the exemplary embodiment, the semiconductor device includes multilayer wirings of a dual damascene structure. The multilayer wirings of the dual damascene structure mean a structure in which many via layers and many wiring layers that include vias and wirings of a dual damascene structure respectively are stacked. Furthermore, the semiconductor device includes a local wiring layer 151 (first wiring layer) formed on a semiconductor substrate 101 and a power wiring layer 153 (second wiring layer) formed on the local wiring layer 151.

The local wiring layer 151 includes an insulation film 103 (first insulation film), plural first vias 105 provided in the insulation film 103, an insulation film 107 (second insulation film) provided on the insulation film 103, and a first wiring 109 provided on the first vias 105 and connected to those first vias 105 in the insulation film 107.

As shown in FIG. 1B, the first via 105 is shaded portions, which are not included in a taper portion 150. The first wiring is placed on the first via 105 and includes the taper portion 150.

The power wiring layer 153 includes an insulation film 119 (third insulation film), plural second vias 121 provided in the insulation film 119, an adhesive layer 123 provided on the insulation film 119, an insulation film 125 (fourth insulation film) provided thereon, and a second wiring 127 provided on the second vias 121 and connected to those second vias 121 in the insulation film 125.

Furthermore, the local wiring layer 151 includes plural layers, each including an insulation film 103, first vias 105 provided in the insulation film 103, an insulation film 107, and a first wiring 109 provided in the insulation film 107. Similarly, the power wiring layer 153 includes plural layers, each including an insulation film 119, second vias 121 provided in the insulation film 119, an adhesive film 123, and an insulation film 125, and a second wiring 127 provided in the insulation film 125.

Hereunder, there will be described how to manufacture the semiconductor device in the exemplary embodiment in an order of processes. In this exemplary embodiment, it is premised that via-first processes are employed for manufacturing the semiconductor device having a dual damascene structure. The dual damascene methods of the related art can also be employed to manufacture the semiconductor device in this exemplary embodiment.

Concretely, for example, an insulation film 103 (first insulation film) and another insulation film 107 (second insulation film) are formed sequentially on a semiconductor substrate 101 including single crystal silicon. And, for example, a wiring layer is formed under the insulation film 103. Then, via holes and wiring grooves are formed in the insulation films 103 and 107 respectively by stepwise etching and by lithography. After that, for example, a Ta and TaN stacked tantalum-based barrier metal film (not shown) is formed all over the surface of each of the insulators 103 and 107 that include the via holes and wiring grooves formed beforehand, respectively.

After that, for example, a plated copper film (at a film thickness of 200 nm at the flat portion) is formed by an electrolytic plating method. At this time, a seed metal film (about 100 nm) may be formed on the barrier metal film by sputtering, then a plated metal film may be formed so as to cover the seed metal film. The seed metal film may be formed only with copper or the seed metal film may include different kinds of elements. A process for annealing the plated metal film may be added after the processes. After that, the metal film outside the wiring grooves is removed by the CMP (Chemical Mechanical Polishing) method. This completes forming of the insulation film 103 that includes the first vias 105 and the insulation film 107 that includes the first wiring 109 in the local wiring layer 151 respectively. Here, the insulation film 103 includes a via layer and the insulation film 107 has a wiring layer.

The local wiring layer 151 may also include plural layers, each including an insulation film that includes the first vias and another insulation film that includes the first wiring. On the insulation film 107 are further formed an insulation film 111 that includes the first vias 113 and another insulation film 115 that includes a first wiring 117.

This means that the insulation film 111 is formed, and then the insulation film 115 is formed on the insulation films 111 in the same procedures as those for forming the insulation film 103 that includes the first vias 105 and the insulation film 107 that includes the first wiring 109. Here, the insulation film 111 includes a via layer and the insulation film 115 formed on the insulation film 111 includes a wiring layer. The wiring width, vias diameter, vias height, etc. of the wirings and vias in the insulation films 115 and 111 are almost the same as those of the vias and wirings in the insulation films 107 and 103. This completes forming of the local wiring layer 151.

Next, the power wiring layer 153 is formed. At first, the insulation film 119 (third insulation film) is formed on the insulation film 115. Then, the adhesive layer 123 and the insulation film 125 (fourth insulation film) are formed sequentially on the insulation film 119. The adhesive layer 123 improves the adhesion between the insulation films 110 and 125, thereby improving the destructive strength of the semiconductor. The adhesive layer 123 also functions as an etching stopper when forming grooves in the insulation film 125.

After that, via holes and wiring grooves are formed sequentially in the insulation films 119 and 125 just like in the above processes. The via holes and wiring grooves formed above are then filled with a metal film. Then, the metal film deposited outside the wiring grooves is removed by CMP. This completes forming of the insulation film 119 that includes the second vias 121, the adhesive layer 123, and the insulation film 125 that includes the second wiring 127. Here, the insulation film 119 includes a via layer and the insulation film 125 includes a wiring layer. The wiring width, via holes diameter, via holes height, etc. of the wirings and vias in the insulation films 119 and 125 are larger than those of the vias and wirings in the insulation films 103, 107, 111, and 115.

The power wiring layer 153 may include plural layers, each including an insulation film having the second vias, an adhesive layer, and another insulation film having the second wiring. In the structure shown in this exemplary embodiment as an example, on the insulation film 125 is further formed an insulation film 129 having the second vias 131, an adhesive layer 133, another insulation film 135 having the second wiring 137, still another insulation film 139 having the second vias 141, an adhesive layer 143, and still another insulation film 145 having the second wiring 147.

In other words, the insulation film 129 that includes the second vias 131, the adhesive layer 133, the insulation film 135 that includes the second wiring 137, the insulation film 139 having the second vias 141, the adhesive layer 143, and the insulation film 145 having the second vias 147 are formed in the same procedures as those for forming the insulation films 119 and 125. Here, each of the insulation films 128 and 139 has a via layer and each of the insulation films 135 and 145 has a wiring layer. The wiring width, via holes diameter, via holes height, etc. of the wirings and vias in the insulation films 129 and 139 are almost the same as those of the vias and wirings in the insulation films 119 and 125. This completes forming of the power wiring layer 153, thereby completing the manufacturing of the semiconductor device shown in FIG. 1.

As described above, the semiconductor device in the exemplary embodiment includes a power wiring layer having an adhesive layer between a via layer and a wiring layer, as well as a local wiring layer having no such adhesive layer between a via layer and a wiring layer. Here, the via layer means a layer that includes an insulation film having vias. One via layer may include one kind of insulation films or may include some kinds of insulation films. A wiring layer means a layer that includes an insulation film having wiring grooves. One wiring layer may include one kind of insulation films or may include some kinds of insulation films. A CMP stopper film may be provided in each of the via layer and the wiring layer described above respectively.

The material used for forming the adhesive layer should preferably be a film having a film strength higher than, for example, that of the insulation film of the via layer of the power wiring layer 153. The film strength of the adhesive layer should be, for example, 20 GPa or higher, preferably be 30 GPa or higher. In the exemplary embodiment, the adhesive layer is formed with SiCN.

A layer used as the adhesive layer is decided according to the aspect ratio. Concretely, in a multilayer wiring structure, if it is assumed that the aspect ratio of the wiring having the minimum wiring width is L and the aspect ratio of the vias connected to the lower portion of the wiring is V, the structure then comes to have such an adhesive layer between the wiring layer and the via layer that are in a relationship of L<V. No adhesive layer is provided between the wiring layer and the via layer that are in a relationship of L≧V. In other words, the adhesive layer is formed between the top surface of the via layer and the bottom surface of the wiring layer positioned just above the via layer.

In this exemplary embodiment, an aspect ratio is defined as follows. An aspect ratio of a wiring is represented by a value of wiring height/wiring width. Here, the minimum wiring (width) aspect ratio means the aspect ratio of the wiring having the minimum wiring width among the wirings included in the same layer. An aspect ratio of vias is represented by a value of via height/via diameter.

In this exemplary embodiment, the relationship between the wiring layer and the via layer in the power wiring layer 153 is L<V. The relationship between the wiring layer and the via layer in the local wiring layer 151 is L≧V.

For example, as shown in FIG. 1A, in the power wiring layer 153, the wiring has the width a4 and the height b4 and the via has the diameter a3 and the height b3. The aspect L1 of the wiring is b4/a4 and the aspect V1 of the via is b3/a3. As obvious from FIG. 1A, the relationship of the aspect L1 and V1 is L1<V1. That is, the sectional shape of the wiring 137 is a rectangle which is elongated more than a rectangle shown in the sectional shape of the via 131.

On the contrary, as shown in FIG. 1B, in the local wiring layer 151, the wiring has the width a2 and the height b2 and the via has the diameter a1 and the height a1. The aspect L2 of the wiring is b2/a2 and the aspect V2 of the via is b1/a1. As obvious from FIG. 1B, the relationship of the aspect L2 and V2 is L2>V2. That is, the sectional shape of the via 105 is a rectangle which is elongated more than a rectangle shown in the sectional shape of the wiring 109.

When the relationship of the aspect L and V is L=V, the rectangle shown in the sectional shape of a via is homothetic to the rectangle shown in the sectional shape of a wiring.

In the power wiring layer 153 that satisfies a relationship of L<V, the wiring is long and the wiring pitch is relatively wide. Concretely, a wide wiring pitch means that the wiring pitch in the power wiring layer 153 is wider than that in the local wiring layer 151. For example, the wiring pitch is 0.8 μm.

On the other hand, in the local wiring layer 151 that satisfies L≧V, the wiring is relatively short and the wiring pitch is narrow. A relatively narrow wiring pitch means that the wiring pitch in the local wiring layer is narrower than that in the power wiring layer 153. For example, the wiring pitch is 0.4 μm or shorter.

Figure 3:
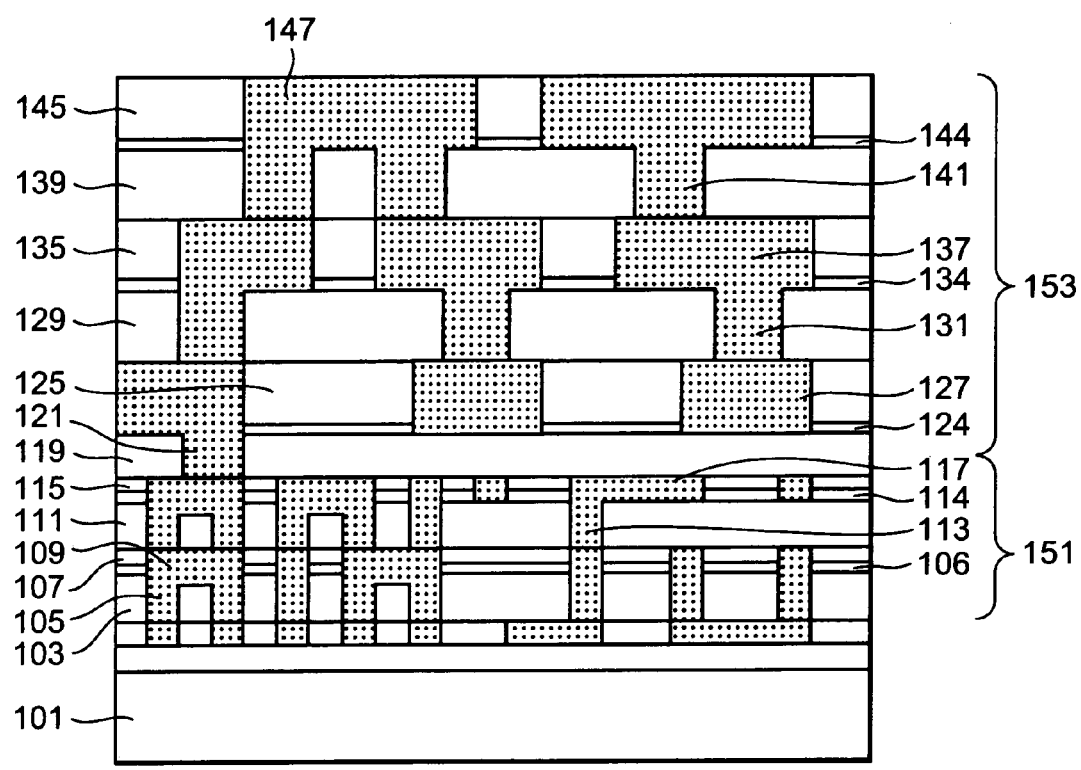
FIG. 3 is another explanatory cross sectional view of the structure of a semiconductor device of a related art.

Here, in the local wiring layer 151, both wiring and via pitches are relatively narrow and close to each other. Consequently, it is required to reduce the capacitance between wirings to improve the clock operation frequency. This is why a low-k film having a low dielectric constant is generally used for the local wiring layer 151. In case of the structure as shown in FIG. 3, therefore, the capacitance between wirings cannot be reduced.

On the other hand, in this exemplary embodiment, there is no adhesive layer having a high dielectric constant between the top surface of the via layer and the bottom surface of the wiring layer, so the capacitance between wirings can be reduced. As a result, the yield of the vias is improved and the resistance to both electro migration (EM) and stress migration (SM) can be improved, thereby the reliability of the semiconductor device is improved.

On the other hand, in the power wiring layer 153, because the wide wiring pitch is wide, the reduction of the capacitance between wirings is not required so much. Instead, the adherence between the via layer and the wiring layer is considered as important in the power wiring layer 153. In the exemplary embodiment, therefore, an adhesive layer is provided for the power wiring layer to prevent the separation between layers that might otherwise occur in assembling processes. As a result, the destructive strength in those assembling processes is improved, thereby the yield is improved.

In case of the semiconductor device disclosed in Japanese Unexamined Patent Application Publication No. 2007-19187), only the top layer is provided with a stopper layer. This is because accurate controllability is required for forming deep wiring grooves. However, in case of a semiconductor device having a multilayer wiring structure, the adhesion cannot be improved satisfactorily only by providing the top layer with a stopper layer. In other words, in a wiring layer that is equivalent to a power wiring layer, which has a relatively wide wiring pitch, separation between layers is also expected to occur in wiring layers other than the top one. This is why the exemplary embodiment of the present invention provides an adhesive layer for each wiring layer that satisfies a relationship of L<V with reference to the aspect ratio L of the minimum wiring width and the aspect ratio V of the vias. Consequently, the yield lowering to be caused by the layer separation in assembling processes can be reduced significantly.

This means that distinction is made between a layer requiring an adhesive layer and a layer requiring no adhesive layer according to both the wiring aspect ratio and the via aspect ratio in the exemplary embodiment. This is why the present invention has made it possible to reduce the capacitance between wirings while improving the assembling yield.

Also in the exemplary embodiment, a relationship of V1>V2 is preferably assumed if the via aspect ratio in the power wiring layer 153 is V1 and the via aspect ratio in the local wiring layer is V2. The interlayer separation occurs more in assembling processes when the vias are higher. And the larger the via aspect ratio is, the lower the adhesion between interlayer insulation films becomes. On the other hand, in the local wiring layer 151, the vias are lower. Consequently, there hardly occurs such interlayer separation. In the power wiring layer having an adhesive layer, if the via aspect ratio is larger than that in the local wiring layer, the effect of the exemplary embodiment appears more remarkably.

Furthermore, in the exemplary embodiment, in the local wiring layer 151 having no adhesive layer, each via can be tapered at its aperture at its cross sectional view in the via depth direction. In the exemplary embodiment, the local wiring layer 151 has no adhesive layer. Consequently, when etching the wiring grooves after etching the vias in the via-first manner, there is nothing that might disturb the advance of the etching. This is why the via aperture can be tapered where the top surface of the via and the bottom surface of the wiring come in contact with each other. And as disclosed in the patent document 1 and in the non-patent documents 1 to 3, the local wiring layer 151 is provided with a stopper layer, so the via aperture cannot be tapered in shape. In other words, the stopper layer disturbs the etching of the wiring, so each via and the wiring comes in contact with each other in the vertical direction. In the exemplary embodiment, because the via aperture is tapered at its cross sectional view, the barrier metal and seed layer of vias can be covered favorably. As a result, vias can be buried effectively, thereby the yield of vias is improved and the resistance to both EM and SIV is improved.

Figure 4A:
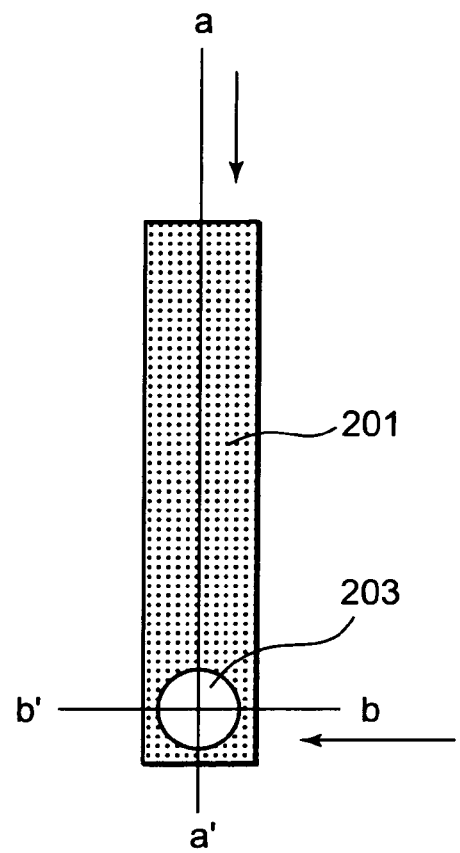
FIG. 4A to 4C are diagrams for describing tapering shapes in a wiring extended direction and in a wiring vertical direction.
Figure 4B:
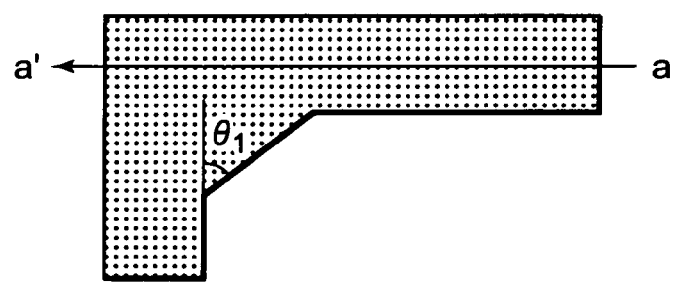
Figure 4C:
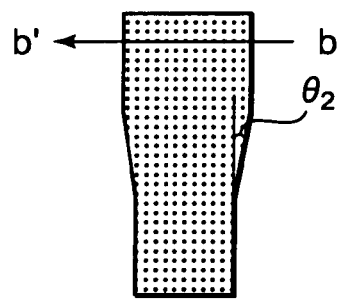

Here, the tapering should preferably be made to satisfy $\theta1 \geqq \theta2$ at the minimum wiring pitch if it is assumed that the tapering angle in the wiring extended direction is $\theta1$ and the tapering angle in the wiring width direction is $\theta2$. FIG. 4 shows such tapered shapes in the extended direction and in the vertical direction of the wiring. FIG. 4A shows a top view of the wiring 201 and the via 203, respectively. Here, the tapering in the wiring extended direction has an angle $\theta1$ formed by a line extended vertically from the bottom surface of the via at the side of the via and by the side surface of the tapering in a cross sectional view taken on line a-a' (FIG. 4B) in the extended direction of the wiring 201. The tapering in the vertical direction of the wiring has an angle $\theta2$ formed by a line extended vertically from the bottom surface at the side of the via and by the side surface of the tapering at a cross sectional view (FIG. 4C) taken on line b-B' in the width direction of the wiring 202. The tapering shape satisfies a relationship of angle $\theta1 \geqq$ angle $\theta2$. Here, the tapering angle in the wiring extended direction should preferably be larger than the tapering angle in the wiring width direction.

The via aperture can be tapered by, for example, the method shown in FIGS. 5 and 6. Hereunder, the processes for the tapering will be described. For example, the via-first method is used to process the local wiring layer.

Figure 5A:
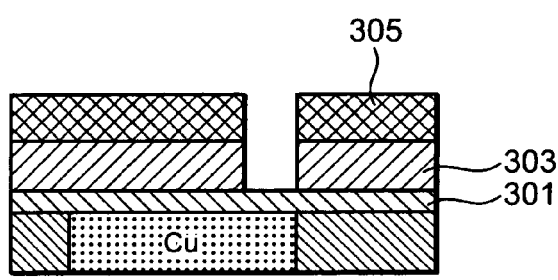
FIG. 5A to 5D are cross sectional views for describing an example of processes for tapering a via aperture.
Figure 5B:
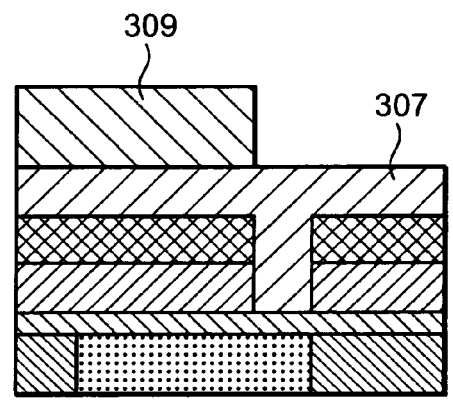

At first, in a layer in which a barrier insulation film 301, an inter-via-layer film 303, and an inter-wiring-layer film 305 are formed sequentially, a via hole is formed (FIG. 5A). Then, a lower organic film 307 is filled in the via hole and the object wiring is patterned with photoresist 309 (FIG. 5B).

Figure 5C:
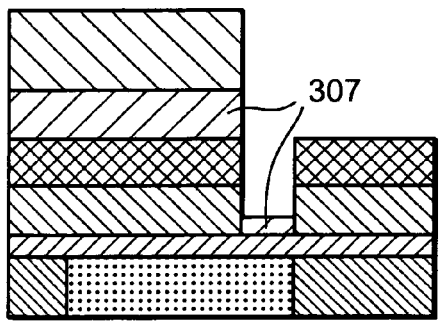

After that, the wiring patterned photoresist 309 is used as an etching mask to etch the lower organic film 307 (FIG. 5C). At this time, etching is carried out so that the lower organic film 307 in the via hole is positioned lower than the top surface of the inter-via-layer film 303. And in order to realize the tapering shape at the via aperture, it is indispensable to position the top surface of the lower organic film 307 in the via hole lower than the top surface of the inter-via-layer film 303. The etching gas used for the lower layer organic film 307 may be any of $O_2$ and $CF_4$.

Figure 5D:
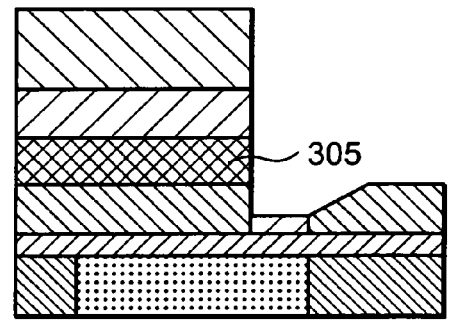
Figure 6A:
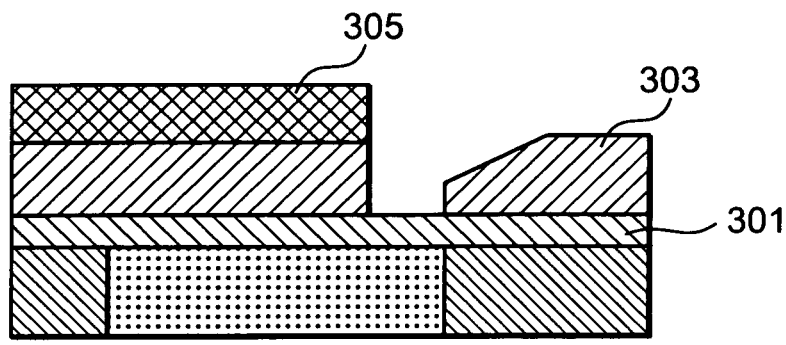
FIG. 6A to 6C are other cross sectional views for describing an example of processes for tapering a via aperture.
Figure 6B:
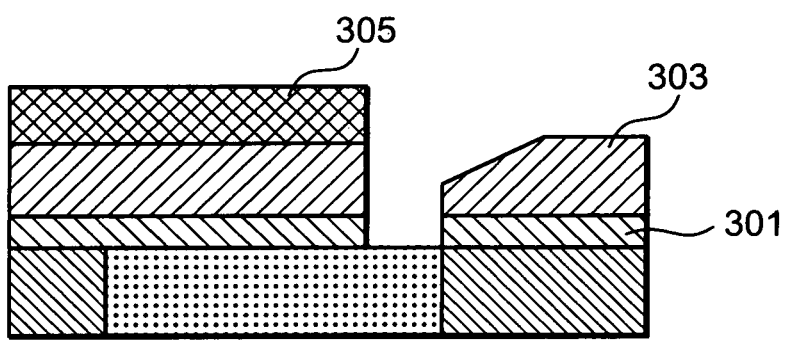

After that, the inter-wiring-layer film 305 is etched with CHF3 (FIG. 5D). In addition, the photoresist 309 and the lower organic film 307 are removed (FIG. 6A). Furthermore, the barrier insulation film 301 is etched back to form a wiring layer and a via layer (FIG. 6B.

Figure 6C:
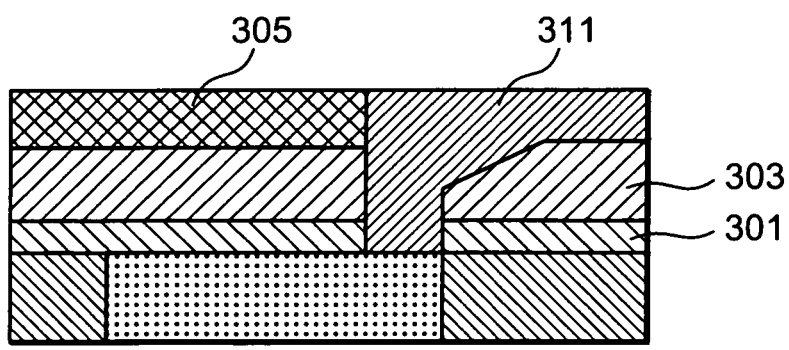

After that, metalizing and Cu CMP treatments are carried out to bury the wiring and via layers to form a Cu wiring 311 (FIG. 6C).

It is noted that Japanese Unexamined Patent Application Publication No. 2002-319617 discloses a taper structure in a dual a dual damascene.

In the exemplary embodiment, in the local wiring layer, the film strength of the insulation film used for the via layer should preferably be higher than that of the interlayer insulation film used for the wiring layer. This is because the Cu occupation rate in the wiring is larger than that in the via part. Consequently, the via part film strength can be raised to compensate the Cu occupation rate of the via part, thereby preventing film damages.

In the exemplary embodiment, in the local wiring layer, an altered layer of the insulation film used to form the via layer should preferably be provided along the phase boundary between the via forming insulation layer and the wiring layer forming insulation film. This is to align the wirings in height.

The altered layer mentioned above means a film altered from a via layer forming insulation film by treating its top surface by plasma or by chemical fluid. The plasma treatment can use, for example, nitrogen, argon, or helium as a gas. When in a reducing atmosphere, the plasma treatment can be, for example, ammonium plasma treatment.

While descriptions have been made for the exemplary embodiment of the present invention with reference to the accompanying drawings, the configuration may be modified freely.

For example, in the above exemplary embodiment, the adhesive layer is made of SiCN. However, in order to improve the assembling strength of the multilayer wiring structure, the adhesive layer may not be limited only to that. For example, the layer may be made of any of SiC, SiN, SiON, etc.

Various low dielectric constant materials can be used for an insulation film to form the local wiring layer 151 and the power wiring layer 153.

As a material used to form the insulation film in the local wiring layer 151, at least one element can be selected from a group consisting of polyhydrogensiloxane such as SiOC, porous SiOC, SiOCH, ladder-type hydrogenated siloxane, hydrogensilsesquioxane (HSQ), methylsilsesquioxane (MSQ), methylhydrogensilsesquioxane (MHSQ); and aromatic hydrocarbon contained organic resin such as divinylsiloxane-bis-benzocyclobutene (BCB). And as another example of the material usable for the insulation film in the local wiring layer 151, there is non-fluorine-based aromatic hydrocarbon contained organic resin or porous non-fluorine-based aromatic hydrocarbon contained organic resin. As concrete examples of the non-fluorine-based aromatic hydrocarbon contained organic resin, there are SiLK (registered trademark) and porous SiLK.

As materials usable for the insulation film in the power wiring layer 153, for example, there is at least one element selected from a group consisting of $SiO_2$, ladder-type hydrogenated siloxane, SiOC, and SiOF. Among those elements, the film should preferably contain ladder oxide such as ladder-type hydrogenated siloxane. For example, the film should preferably be a ladder-type hydrogenated siloxane film or a laminated film consisting of the ladder-type hydrogenated siloxane film and $SiO_2$ film or suchlike. Ladder-type hydrogenated siloxane means polymer having a ladder type molecular structure. The polymer should preferably has a dielectric constant of 2.9 or lower and low film density in order to prevent wiring delays. For example, the film density should preferably be 1.50 $g/cm^3$ to 1.58 $g/cm^3$ and the refraction rate of a 633 nm film should preferably be 1.38 to 1.40. As a concrete example of the film material, there is L-Ox (trademark) or the like.

Figures 7, 8:
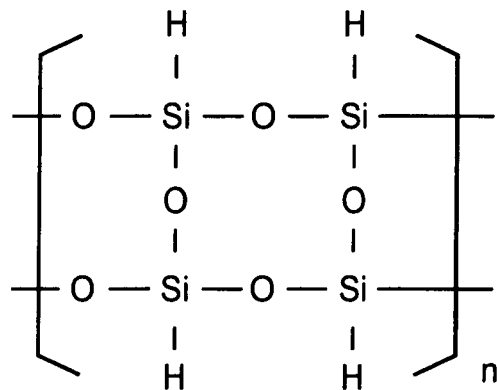
FIG. 7 is a diagram for showing a structure of the L-Ox (trademark) having a ladder-type hydrogenated siloxane structure.
FIG. 8 is a diagram for describing physical property data of the L-Ox (trademark).

FIG. 7 shows a structure of the L-Ox having a ladder-type hydrogenated siloxane structure. In FIG. 7, n denotes a positive number of 1 or greater. FIG. 8 shows the physical property data of the L-Ox having such a structure.

In the above exemplary embodiment, there have been described how to manufacture a semiconductor device that includes a local wiring layer having two layers including a via layer and a wiring layer respectively, as well as a power wiring layer having three layers including a via layer, an adhesive layer, and a wiring layer respectively. However, the structure of the semiconductor device is not limited only to that; each of the local wiring layer and the power wiring layer may be structured to have each of those layers by one or more.

Further, it is noted that Applicant's intent is to encompass equivalents of all claim elements, even if amended later during prosecution.

What is claimed is:
1. A semiconductor device, comprising:
a semiconductor substrate;
a first wiring layer formed on the semiconductor substrate such that an insulating film in the first wiring layer includes a film selected from a porous insulating film, SiOCH, ladder-type hydrogenated siloxane, hydrogensilsesquioxane (HSQ), methylsilsesquioxane (MSQ), methylhydrogensilsesquioxane (MHSQ), and divinylsiloxane-bis-benzocyclobutene (BCB),
the first wiring layer comprising a first via having a first aspect ratio and a first wire having a second aspect ratio,
the first via and the first wire comprising a dual damascene structure comprising a porous insulating film,
the first wiring layer further including a second via and a second wire,
the second via and the second wire comprising the dual damascene structure,
the first wire and the second wire being arranged separately in a first direction such that a width, in the first direction, of the second wire is greater than a width, in the first direction, of the first wire,
the second wire provided on the second via and including a taper portion being tapered at an aperture thereof, in a cross sectional view, in a via depth direction such that a tapering angle of the taper portion of the second wire is greater than a tapering angle of a taper portion of the first wire provided on the first via, and
the first aspect ratio being equal to or smaller than the second aspect ratio such that a tapered portion of the first via is included in the second aspect ratio; and
a second wiring layer overlying the first wiring layer,
the second wiring layer comprising a third via having a third aspect ratio and a third wire having a fourth aspect ratio,
the third via and the third wire comprising the dual damascene structure, and
the third aspect ratio being larger than the fourth aspect ratio.

2. The semiconductor device according to claim 1, wherein the tapering angle of the taper portion of the second wire is greater than a tapering angle of a taper portion of the third wire.

3. The semiconductor device according to claim 1, further comprising:
an adhesion layer provided between a first film including the third via in the second wiring layer and a second film including the third wire in the second wiring layer.

4. The semiconductor device according to claim 1, wherein the first wiring layer comprises other than an adhesive layer.

5. A semiconductor device, comprising:
a semiconductor substrate;
a first wiring layer formed on the semiconductor substrate such that an insulating film in the first wiring layer includes a film selected from a porous insulating film, SiOCH, ladder-type hydrogenated siloxane, hydrogensilsesquioxane (HSQ), methylsilsesquioxane (MSQ), methylhydrogensilsesquioxane (MHSQ), and divinylsiloxane-bis-benzocyclobutene (BCB),
the first wiring layer comprising a first via and a first wire, the first via and the first wire comprising a dual damascene structure comprising a porous insulating film, the first wiring layer further including a second via and a second wire, the second via and the second wire comprising the dual damascene structure, the first wire and the second wire being arranged separately in a first direction such that a width, in the first direction, of the second wire is greater than a width, in the first direction, of the first wire, and the second wire provided on the second via and including a taper portion being tapered at an aperture thereof, in a cross sectional view, in a via depth direction such that a tapering angle of the taper portion of the second wire is greater than a tapering angle of a taper portion of the first wire provided on the first via; and a second wiring layer overlying the first wiring layer, the second wiring layer comprising a third via and a third wire, and the third via and the third wire comprising the dual damascene structure.

6. The semiconductor device according to claim 5, wherein the tapering angle of the taper portion of the second wire is greater than a tapering angle of a taper portion of the third wire.

7. The semiconductor device according to claim 5, wherein the first wiring layer is devoid of an adhesive layer.

8. The semiconductor device according to claim 5, further comprising:
an adhesion layer provided between a first film including the third via in the second wiring layer and a second film including the third wire in the second wiring layer.

9. A semiconductor device, comprising:
a semiconductor substrate;
a first wiring layer formed on the semiconductor substrate,
the first wiring layer comprising a first via and a first wire,
the first via and the first wire comprising a dual damascene structure having a porous insulating film,
the first wiring layer further including a second via and a second wire,
the second via and the second wire comprising the dual damascene structure,
the first wire and the second wire being arranged separately in a first direction such that a width, in the first direction, of the second wire is greater than a width, in the first direction, of the first wire, and
the second wire provided on the second via and including a taper portion being tapered at an aperture thereof, in a cross sectional view, in a via depth direction such that a tapering angle of the taper portion of the second wire is greater than a tapering angle of a taper portion of the first wire provided on the first via; and
a second wiring layer overlying the first wiring layer,
the second wiring layer comprising a third via and a third wire, and
the third via and the third wire comprising the dual damascene structure.

10. The semiconductor device according to claim 9, wherein the tapering angle of the taper portion of the second wire is greater than a tapering angle of a taper portion of the third wire.

11. The semiconductor device according to claim 9, wherein the first wiring layer is devoid of an adhesive layer.

12. The semiconductor device according to claim 9, further comprising:
an adhesion layer provided between a first film including the third via in the second wiring layer and a second film including the third wire in the second wiring layer.

* * * * *